United States Patent [19]
Teter et al.

[11] Patent Number: 5,451,821
[45] Date of Patent: Sep. 19, 1995

[54] MAGNETOSTRICTIVE ACTUATOR WITH AUXILIARY LEAKAGE REDUCING MAGNETIC BIAS

[75] Inventors: Joseph P. Teter, Silver Spring; James B. Restorff, College Park, both of Md.

[73] Assignee: The United States of America as represented by the Secretary of the Navy, Washington, D.C.

[21] Appl. No.: 116,594

[22] Filed: Aug. 30, 1993

[51] Int. Cl.⁶ .......................................... H01L 41/12
[52] U.S. Cl. .................................................. 310/26
[58] Field of Search ..................... 310/26; 335/215; 318/118

[56] References Cited

U.S. PATENT DOCUMENTS

| | | | |
|---|---|---|---|
| 4,959,567 | 9/1990 | Ealey et al. | 310/26 |
| 5,039,894 | 8/1991 | Teter et al. | 316/26 |
| 5,039,943 | 8/1991 | Weber et al. | 324/244 |
| 5,184,037 | 2/1993 | Kobayashi et al. | 310/26 |
| 5,249,117 | 9/1993 | Greenough et al. | 364/150 |

Primary Examiner—Steven L. Stephan
Assistant Examiner—Judson H. Jones
Attorney, Agent, or Firm—Jacob Shuster

[57] ABSTRACT

Flux leakage resulting from interaction between the static bias flux and the variable magnetic flux additively applied to obtain magnetostrictive deformation of an active actuator element, is reduced by bias flux of a separate magnetic field perpendicular to the orientation of the additively applied static bias and variable magnetic flux to improve actuator operation.

8 Claims, 1 Drawing Sheet

MAGNETOSTRICTIVE ACTUATOR WITH AUXILIARY LEAKAGE REDUCING MAGNETIC BIAS

The present invention relates generally to actuators within which magnetic bias and variable magnetic flux fields are generated to cause magnetostrictive deformation of an active component exposed to such magnetic fields.

BACKGROUND OF THE INVENTION

Magnetostrictive actuators of the foregoing type are generally known in the art, as disclosed for example in U.S. Pat. Nos. 4,959,567 and 5,039,894 to Ealey et al. and Teter et al., respectively. In such actuators the static magnetic bias field and the electromagnetically generated variable magnetic field have the same flux orientation parallel to the direction of strain or deformation of the active magnetostrictive component. According to the Ealey et al. patent, the magnetic pre-bias applied to the active component is adjusted to a desired stress/field characteristic point by the additive effect of concentric magnetic fields to improve actuator performance. According to the Teter et al. patent, operational performance is improved by frictional bias on the slide bearing surfaces of the active component applied by forces transverse to its direction of magnetostrictive deformation.

Because of the non-linearity between magnetostrictive strain and flux density of the concentric magnetic fields to which the active component is exposed in the foregoing actuators, excessive energy loss occurs. Also, there is considerable flux leakage caused by the interaction between the non-uniform flux in the active component and the electromagnetically generated variable magnetic field.

It is therefore an important object of the present invention to provide an improved magnetostrictive actuator of the foregoing type, wherein energy loss and flux leakage is reduced to lower power consumption, provide greater ease of control and a longer useful stroke for the active component.

SUMMARY OF THE INVENTION

In accordance with the present invention, an auxiliary permanent bias magnet is installed within a magnetostrictive actuator to create a separate magnetic flux biasing field orientated perpendicular to the orientation of the concentric magnetic flux fields axially aligned with the active component in the direction of magnetostrictively induced actuator motion. The auxiliary bias magnet is positioned in concentric relation to the active component and the static field magnets through which a stress/field bias point is predetermined for magnetostrictive deformation of the active component triggered by energization of an excitation coil also positioned in coaxial relation to the active component.

BRIEF DESCRIPTION OF DRAWING FIGURES

A more complete appreciation of the invention and many of its attendant advantages will be readily appreciated as the same becomes better understood by reference to the following detailed description when considered in connection with the accompanying drawing wherein:

FIG. 1 is a partial side section view of a magnetostrictive actuator constructed in accordance with one embodiment of the present invention; and FIG. 2 is a comparative graph depicting operational characteristics of the actuator.

DETAILED DESCRIPTION OF PREFERRED EMBODIMENTS

Figure 1:
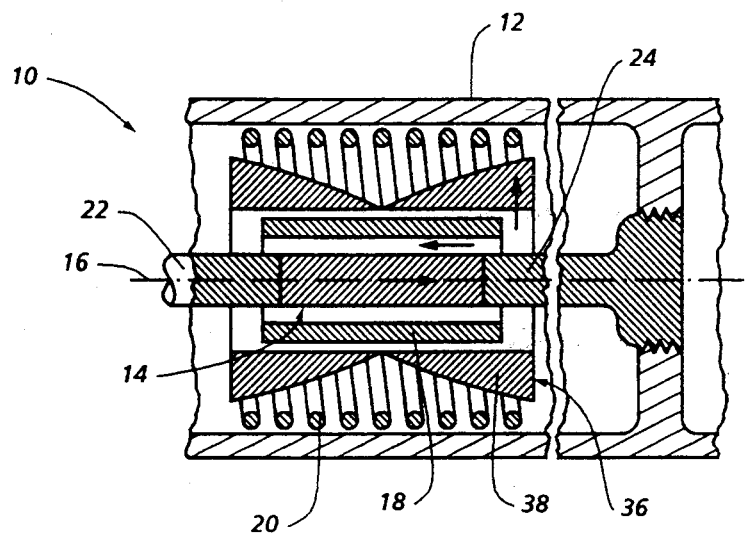

Referring now to the drawing in detail, FIG. 1 illustrates a magnetodistortive type of actuator, generally referred to by reference numeral 10. The actuator includes an outer tubular support housing 12 within which an active component 14 is positioned in alignment with a central axis 16. The active component, in the form of a cylindrical rod element made of a suitable magnetostrictive material such as a crystalline Terfernol-D type, is positioned within a static magnetic bias field established by constant flux from permanent magnets 18 in close radial spaced relation to the active component. The magnetic flux from the permanent magnets 18 orientates the magnetic bias field parallel to the axis 16 of the active rod element 14, as depicted by flux arrows in FIG. 1, for magnetostrictive deformation. Such deformation is effected relative to a stress/field bias point established by the bias magnets 18 when the active component 14 is subjected to the flux of a variable magnetic field of the same flux orientation superimposed by energization of an electromagnetic excitation coil 20. The electromagnetic excitation coil 20 is positioned radially outward of the bias magnets 18 in coaxial relation to the active rod element 14 within the support housing 12, in the embodiment shown in FIG. 1.

The active rod element 14 is also connected to and positioned in axial alignment between other components of the actuator 10 extending into the magnetic fields aforementioned, such as a push rod 22 and a fixed support rod 24. Thus, axial deformation of the active rod element 14 will be transmitted at one axial end to the push rod 22 in view of the anchoring of its opposite axial end by fixed support rod 24 in the embodiment shown in FIG. 1. Other physical restraints and/or magnetic additive effects may be imposed on the active component to influence the axial motion transmitted to the push rod.

Figure 2:
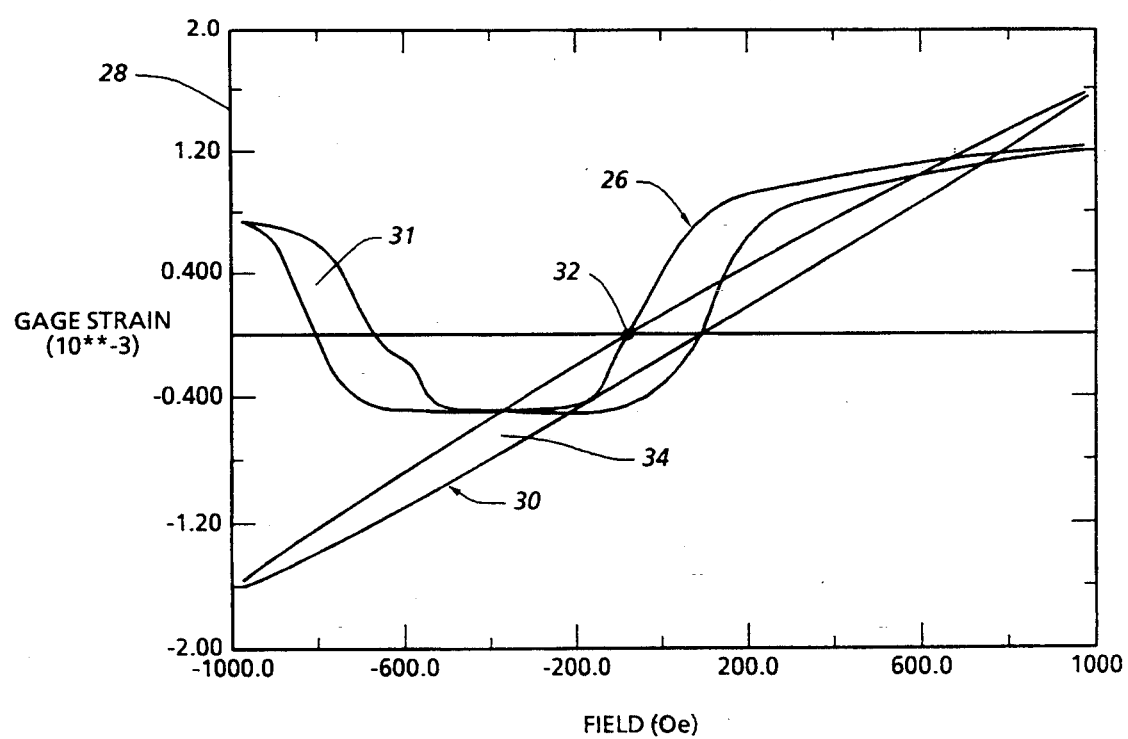

Typically, reciprocating motion is produced by magnetostrictive deformation of the active component of the actuator along its axis in response to variation in flux density of the magnetic field, electromagnetically imposed through the excitation coil as plotted by curves 26 in FIG. 2 with respect to strain and field flux density coordinates 28 and 30. As seen from curves 26, deformation strain of the active component is non-linear because of the interaction between the non-spatially uniform static bias field and the variable magnetic field resulting in non-uniform flux to which the active component is exposed. Because of such non-linearity and the heat loss, measured by the areas 31 between the strain/field curves 26, a considerable amount of flux leakage and wasted motion was involved in the operation of magnetostrictive actuators of the type hereinbefore described.

In accordance with the present invention, magnetostrictive actuator operation is significantly improved with respect to the non-linearity of its strain/field characteristic, as reflected by comparison of curves 26 with curves 30 in FIG. 2 intersecting at common strain/field bias points 32. The curves 30 reflect the improved operational characteristics of actuator 10, including reduced heat loss as measured by area 34. Such operational improvement also involves a significant reduction in flux leakage and is achieved by means of an auxiliary permanent magnet configuration 36 as shown in FIG. 1. The magnet configuration 36 is operatively positioned radially between the bias magnets 18 and the excitation coil 20 in the embodiment illustrated, and includes generally triangular portions 38 which extend axially beyond the active component 14 and bias magnets 18 to generate a separate magnetic field circuit having a flux orientation perpendicular to the additive flux orientations of the static bias and variable magnetic fields, respectively associated with the bias magnets 18 and excitation coil 20. The combined flux pattern resulting from the introduction of the auxiliary magnet configuration 36 has been shown to increase the strength of the combined magnetic fields, to which the active component 14 is subjected, by a factor of 2.5 while the flux leakage is reduced by a factor of approximately 20.

Obviously, numerous other modifications and variations of the present invention are possible in light of the foregoing teachings. It is therefore to be understood that within the scope of the appended claims the invention may be practiced otherwise than as specifically described.

What is claimed is:

1. A magnetodistortive actuator comprising: a support; an active component made of magnetostrictive material; biasing means for establishing a static magnetic field of predetermined flux orientation within which the active component is positioned; electromagnetic means mounted by the support for generating a variable magnetic field to which the active component is subjected causing deformation thereof; and auxiliary bias means applying a magnetic flux in transverse relation to said predetermined magnetic flux orientation for reducing external flux leakage caused by interaction between the static and variable magnetic fields during said deformation of the active component.

2. The actuator as defined in claim 1 wherein said biasing means and said electromagnetic means are respectively formed by a permanent bias magnet and an excitation coil supported in radially spaced relation to a common axis along which said deformation of the active component is induced by the variable magnetic field.

3. The actuator as defined in claim 2 wherein said auxiliary bias means is radially positioned between the permanent bias magnet and the excitation coil.

4. The actuator as defined in claim 3 wherein said auxiliary bias means is a permanent magnet configuration reducing non-linearity between flux density of the magnetic fields and resulting strain of the active component during said deformation thereof.

5. The actuator as defined in claim 1 wherein said auxiliary bias means is a permanent magnet configuration reducing non-linearity between flux density of the magnetic fields and resulting strain of the active component during said deformation thereof.

6. In a magnetostrictive actuator having a support, an elongated active component, biasing means for establishing a static magnetic field of predetermined flux orientation within which the active component is positioned; and electromagnetic means mounted by the support for generating a variable additive magnetic field to which the active component is subjected causing deformation thereof, the improvement residing in: means for applying a magnetic bias flux perpendicular to said predetermined magnetic flux orientation, including a permanent magnet configuration reducing non-linearity between flux density of the magnetic fields and resulting strain of the active component during said deformation thereof.

7. The actuator as defined in claim 6 wherein said biasing means and said electromagnetic means are respectively formed by a permanent bias magnet and an excitation coil supported in radially spaced relation to a common axis along which said deformation of the active component is induced by the variable additive magnetic field.

8. The improvement as defined in claim 7 wherein the permanent magnet configuration is radially positioned between the permanent bias magnet and the excitation coil.

* * * * *